(12) United States Patent
Tseng et al.

(10) Patent No.: US 10,562,763 B2
(45) Date of Patent: Feb. 18, 2020

(54) FENCE STRUCTURE TO PREVENT STICTION IN A MEMS MOTION SENSOR

(71) Applicant: Taiwan Semiconductor Manufacturing Co., Ltd., Hsin-Chu (TW)

(72) Inventors: Lee-Chuan Tseng, New Taipei (TW); Chang-Ming Wu, New Taipei (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 0 days.

(21) Appl. No.: 15/688,128

(22) Filed: Aug. 28, 2017

(65) Prior Publication Data

US 2019/0062153 A1  Feb. 28, 2019

(51) Int. Cl.
*B81C 1/00* (2006.01)
*B81B 7/02* (2006.01)
(Continued)

(52) U.S. Cl.
CPC .......... *B81C 1/00166* (2013.01); *B81B 3/001* (2013.01); *B81B 3/0005* (2013.01); *B81B 3/0008* (2013.01); *B81B 3/0075* (2013.01); *B81B 7/02* (2013.01); *B81C 1/0023* (2013.01); *B81C 1/00238* (2013.01); *B81C 1/00246* (2013.01); *B81C 1/00404* (2013.01); *B81C 1/00531* (2013.01); *B81C 1/00563* (2013.01); *B81C 1/00619* (2013.01); *B81C 1/00626* (2013.01); *B81C 1/00952* (2013.01); *B81C 1/00984* (2013.01); *H01L 21/76834* (2013.01); *B81B 7/0006* (2013.01); *B81B 7/0032* (2013.01); *B81B 2201/01* (2013.01);
(Continued)

(58) Field of Classification Search
CPC ............ B81C 1/00166; B81C 1/00984; B81C 1/00539; B81C 1/00531; B81C 1/00547; H01H 2059/0072; B81B 3/0013; B81B 3/001; B81B 3/0005; H01L 2924/1461
See application file for complete search history.

(56) References Cited

U.S. PATENT DOCUMENTS

2003/0146464 A1   8/2003  Prophet
2003/0210124 A1*  11/2003  Volant ................ H01H 59/0009
                                                            337/36
(Continued)

*Primary Examiner* — Lex H Malsawma
*Assistant Examiner* — Laura M Dykes
(74) *Attorney, Agent, or Firm* — Eschweiler & Potashnik, LLC

(57) ABSTRACT

The present disclosure relates to a microelectromechanical systems (MEMS) package featuring a flat plate having a raised edge around its perimeter serving as an anti-stiction device, and an associated method of formation. A CMOS IC is provided having a dielectric structure surrounding a plurality of conductive interconnect layers disposed over a CMOS substrate. A MEMS IC is bonded to the dielectric structure such that it forms a cavity with a lowered central portion the dielectric structure, and the MEMS IC includes a movable mass that is arranged within the cavity. The CMOS IC includes an anti-stiction plate disposed under the movable mass. The anti-stiction plate is made of a conductive material and has a raised edge surrounding at least a part of a perimeter of a substantially planar upper surface.

20 Claims, 11 Drawing Sheets

(51) Int. Cl.
*B81B 3/00* (2006.01)
*H01L 21/768* (2006.01)
*B81B 7/00* (2006.01)
*B81C 3/00* (2006.01)
*H01L 23/532* (2006.01)
*H01L 23/522* (2006.01)
*H01L 23/528* (2006.01)

(52) U.S. Cl.
CPC ............ *B81B 2201/0235* (2013.01); *B81B 2201/0242* (2013.01); *B81B 2201/0257* (2013.01); *B81B 2201/0264* (2013.01); *B81B 2201/03* (2013.01); *B81B 2201/054* (2013.01); *B81B 2203/0109* (2013.01); *B81B 2203/0118* (2013.01); *B81B 2203/0163* (2013.01); *B81B 2203/04* (2013.01); *B81B 2203/053* (2013.01); *B81B 2207/015* (2013.01); *B81B 2207/07* (2013.01); *B81B 2207/09* (2013.01); *B81C 1/0015* (2013.01); *B81C 1/00142* (2013.01); *B81C 1/00269* (2013.01); *B81C 3/001* (2013.01); *B81C 2201/016* (2013.01); *B81C 2201/0132* (2013.01); *B81C 2201/112* (2013.01); *B81C 2201/115* (2013.01); *B81C 2203/0118* (2013.01); *B81C 2203/032* (2013.01); *B81C 2203/035* (2013.01); *B81C 2203/0735* (2013.01); *B81C 2203/0771* (2013.01); *B81C 2203/0792* (2013.01); *H01L 21/7684* (2013.01); *H01L 21/76807* (2013.01); *H01L 21/76835* (2013.01); *H01L 21/76879* (2013.01); *H01L 23/5226* (2013.01); *H01L 23/5283* (2013.01); *H01L 23/53214* (2013.01); *H01L 23/53219* (2013.01); *H01L 23/53228* (2013.01); *H01L 23/53242* (2013.01); *H01L 23/53257* (2013.01); *H01L 23/53261* (2013.01); *H01L 23/53295* (2013.01)

(56) References Cited

U.S. PATENT DOCUMENTS

| | | | |
|---|---|---|---|
| 2004/0017644 A1* | 1/2004 | Goodwin-Johansson | H01H 59/0009 361/233 |
| 2006/0285191 A1* | 12/2006 | Yang | G02B 26/0841 359/290 |
| 2008/0135386 A1* | 6/2008 | Bozler | H01H 59/0009 200/181 |
| 2008/0315332 A1* | 12/2008 | Kaelberer | B81C 1/00984 257/415 |
| 2009/0111267 A1* | 4/2009 | Park | B81B 3/001 438/692 |
| 2012/0248615 A1* | 10/2012 | Chien | B81C 1/0023 257/770 |
| 2013/0015743 A1 | 1/2013 | Tsai et al. | |
| 2013/0285166 A1* | 10/2013 | Classen | B81C 1/00246 257/415 |
| 2014/0042562 A1* | 2/2014 | Chu | B81B 3/0059 257/415 |
| 2015/0116893 A1* | 4/2015 | Hanihara | B81B 3/001 361/290 |
| 2015/0130044 A1 | 5/2015 | Kuo et al. | |
| 2015/0298965 A1* | 10/2015 | Tsai | B81C 1/00182 257/415 |
| 2016/0167945 A1* | 6/2016 | Chang | B81B 3/001 257/415 |
| 2017/0203962 A1 | 7/2017 | Cheng et al. | |
| 2017/0210612 A1 | 7/2017 | Chen et al. | |

* cited by examiner

FENCE STRUCTURE TO PREVENT STICTION IN A MEMS MOTION SENSOR

BACKGROUND

The use of microelectromechanical systems (MEMS) devices as miniaturized motion, pressure, or acceleration sensing devices, is widespread in many of today's more sophisticated products. For example, MEMS devices are found in personal electronics including smart phones, fitness electronics, and personal computing devices such as notepads and tablets. MEMS devices also enjoy widespread use in vehicle and aerospace applications including, for example, accident detection and airbag deployment systems in cars and guidance systems in aircraft. These devices are also being adapted as medical devices, for example, to monitor a patient's vital signs. For many of these applications the MEMS devices are coupled to application specific integrated circuits (ASIC's) to measure and interpret signals from these devices. More and more applications are being sought with an ever-increasing desire to further miniaturize the size of the sensing elements, to make them more rugged and more economical to fabricate.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1A:
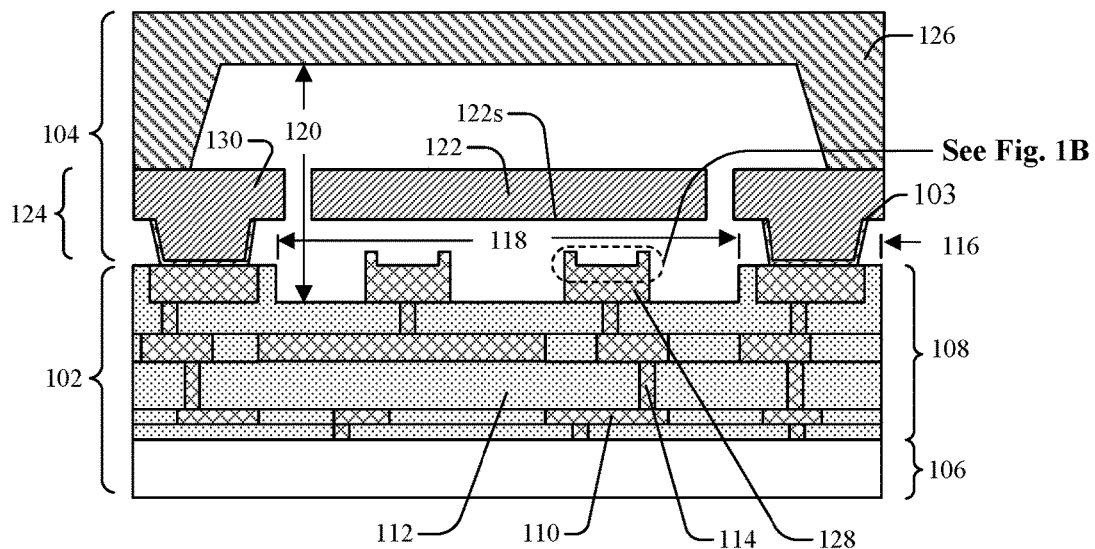
FIGS. 1A-1B illustrate a cross-sectional view of some embodiments of a microelectromechanical system (MEMS) package using a raised edge structure as an anti-stiction feature, and an expanded view of the anti-stiction feature.

The present disclosure provides many different embodiments, or examples, for implementing different features of this disclosure. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper", and the like, may be used herein for ease of description to describe one element or feature's relationship to another element(s) or feature(s) as illustrated in the figures. The spatially relative terms are intended to encompass different orientations of the device or apparatus in use or operation in addition to the orientation depicted in the figures. The device or apparatus may be otherwise oriented (rotated 90 degrees or at other orientations) and the spatially relative descriptors used herein may likewise be interpreted accordingly. Even more, the terms "first", "second", "third", "fourth", and the like are merely generic identifiers and, as such, may be interchanged in various embodiments. For example, while an element (e.g., an opening) may be referred to as a "first" element in some embodiments, the element may be referred to as a "second" element in other embodiments.

Many MEMS devices, such as accelerometers and gyroscopes, comprise a movable mass configured in relation to a fixed electrode plate. The movable mass has a planar surface aligned in parallel and spaced apart from an opposed planar surface of the fixed electrode plate. In response to external stimuli, including forces due to pressure, acceleration, gravity or motion, the movable mass is displaced. This displacement changes a distance between the movable mass and the fixed electrode plate. This changing distance may be detected by a change in capacitive coupling between the movable mass and the fixed electrode and analyzed by appropriate electrical circuits to derive a measurement of a physical quantity associated with the motion, such as acceleration.

One of the design challenges with MEMS devices is to prevent the movable mass from sticking to the fixed electrode or other adjacent parts, an effect known as stiction. As the scale of these devices continues to shrink, and spacing between adjacent surfaces becomes smaller and smaller, prevention of unintended stiction becomes an increasingly important design consideration. Stiction can occur under a number of conditions. During manufacturing stiction can occur when, for example, the movable mass is not fully released from its neighboring surface. It can also occur during normal operation when the movable mass deflections grow to the point that the movable mass comes into contact with neighboring parts.

Stiction can occur due to a number of different physical effects, including those related to capillary action, to van der Walls forces, or electrostatic forces between neighboring components. The extent to which these and other effects may lead to stiction depends on many factors besides the physical spacing between parts. One factor is the physical contact area between the movable mass and stationary surfaces, with minimized contact area reducing the likelihood of a stiction event. Other factors include the temperatures of the surfaces, the hydrophobic or hydrophilic affinity of the surfaces, surface roughness, and coatings and surface adhesion as affected by material choices.

One approach known to minimize stiction is to deposit extra "bumpers" of material above one of the parallel flat surfaces to prevent direct surface to surface contact. While features like bumpers may be effective at minimizing contact area between adjacent parts, they generally require additional fabrication steps and additional expense to pattern and deposit the features on existing flat surfaces. Changing the component materials and applying specialty coatings may also be effective in combating stiction, but these approaches generally complicate manufacturing, add cost, and may add contaminants that impact the operation of these miniaturized sensors.

The present disclosure is related to a MEMS package using a raised edge structure as an anti-stiction feature. The raised edges serve to minimize contact area with the movable mass, while leaving the parallel and planar character of the main surface of the fixed electrode undisturbed. These raised edges also have the advantage of being produced without additional processing steps (e.g., deposition and/or patterning of a bumper material) typically used to produce anti-stiction bumpers. Thus, an anti-stiction plate may be envisioned that reduces the cost of adding anti-stiction features to a MEMS device. As the anti-stiction features are created within the manufacturing process, stiction effects can be mitigated during manufacturing as well as during operation of the MEMS device.

The concept will be illustrated herein with regards to some example MEMS devices, but it will be appreciated that the concept is applicable to other suitable MEMS devices employing movable parts, including for example, actuators, valves, switches, microphones, pressure sensors, accelerators, and/or gyroscopes.

With reference to FIG. 1A, a cross-sectional view of some embodiments of a microelectromechanical system (MEMS) package 100 using a raised edge fence structure as an anti-stiction feature is provided.

The MEMS package 100 comprises a complementary metal oxide semiconductor (CMOS) integrated circuit (IC) 102 and a MEMS IC 104. The CMOS IC 102 comprises a CMOS substrate 106 and a dielectric structure 108 disposed above the CMOS substrate 106. The dielectric structure 108 comprises a plurality of conductive interconnect layers, 110 and 114, interspaced by a plurality of insulating layers 112. In some embodiments, the conductive interconnect layers, 110 and 114, may be comprised of a metal such as aluminum or copper, and the insulating layers 112 may be comprised of an oxide including oxides of silicon and/or silicon nitride. In some embodiments, the conductive interconnect layers, 110 and 114, may comprise conductive wires 110 electrically connected by vias 114. In some embodiments, the dielectric structure 108 has a broad U-shaped" cross-section with raised outer portions 116 representing the vertical legs of the "U" and a planar lowered central portion 118 representing the bottom of the "U". The lowered central portion 118 has a lower height than the adjacent raised outer portions 116 of the dielectric structure 108. In some embodiments, the CMOS substrate 106 may comprise monocrystalline silicon.

The MEMS IC 104 is disposed above and bonded to the dielectric structure 108 by way of a bonding layer 103. The MEMS IC 104, in cooperation with the lowered central portion 118 of the dielectric structure 108, defines a cavity 120. The MEMS IC 104 comprises a MEMS device layer 124 which comprises a movable mass 122 arranged within the cavity 120, and a capping substrate 126. In some embodiments, the movable mass 122 is connected to a fixed portion 130 of the MEMS device layer 124 by one or more springs (not shown), cantilever beams, or other suitable structures (not shown) that allow at least a portion of the movable mass 122 to deflect in at least one direction. The capping substrate 126 may be disposed above and bonded to a back side of the MEMS device layer 124 opposite to the dielectric structure 108, so as to enclose the cavity 120 between the capping substrate 126 and the dielectric structure 108.

Figure 1B:
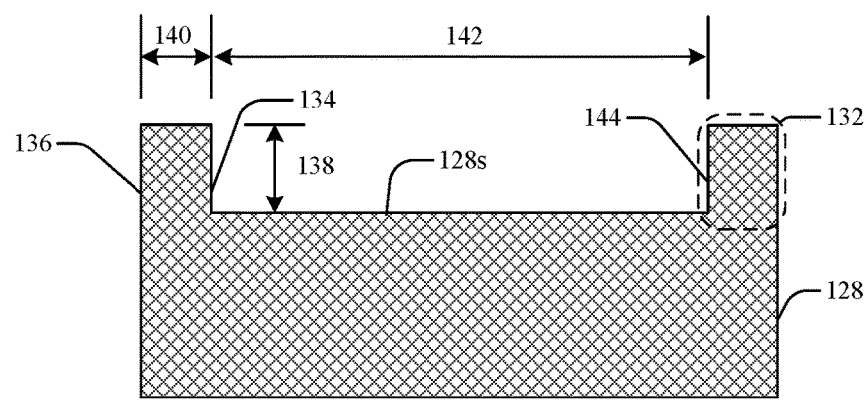

With reference to FIGS. 1A and 1B, the MEMS package 100 further comprises an anti-stiction plate 128 disposed between the movable mass 122 and the lowered central portion 118 of the dielectric structure 108. The anti-stiction plate 128 is made of a conductive material and comprises a planar upper surface 128s substantially aligned under a planar lower surface 122s of the movable mass 122. The anti-stiction plate 128 also comprises a raised edge 132 surrounding at least a part of a perimeter of the planar upper surface 128s.

In some embodiments, the anti-stiction plate 128 may comprise a metal comprising aluminum, tungsten, gold, copper, nickel, or titanium nitride. In some embodiments, the anti-stiction plate 128 may comprise a same material as an uppermost conductive interconnect layer surrounded by the dielectric structure 108. In some embodiments, the raised edge 132 is of the same material and contiguous with the anti-stiction plate 128. The raised edge 132 is configured to limit a contact area between the planar upper surface 128s and the planar lower surface 122s of the movable mass 122 when the movable mass 122 is deflected towards the anti-stiction plate 128. Thus, stiction is mitigated.

With reference to FIG. 1B, in some embodiments the raised edge 132 comprises a cross-sectional profile bounded by neighboring inner sidewall 134 and outer sidewall 136. The cross-sectional profile comprises an edge height 138 defined by a vertical distance between the planar upper surface 128s of the anti-stiction plate 128 and the uppermost extent of the raised edge 132, and an edge width 140 defined by the lateral distance between inner sidewall 134 and outer sidewall 136 as measured along the planar upper surface 128s. In some embodiments, the ratio of the edge height 138 to the edge width 140 is greater than one.

In some embodiments, a span distance 142 laterally separates raised edges 132 on opposed lengths of the perimeter of the anti-stiction plate 128. The span distance 142 is defined by the greatest lateral distance between opposed inner sidewalls 134 and 144, as measured along the planar upper surface 128s of the anti-stiction plate 128. In some embodiments the ratio of the span distance 142 to the edge width 140 is greater than ten.

In some embodiments, the edge height 138 exceeds a contact distance. The contact distance is defined as the minimum separation distance to prevent contact between the planar lower surface 122s of the movable mass 122 and the planar upper surface 128s of the anti-stiction plate 128. In some embodiments, the contact distance may include an amount to account for a nominal distance between the two surfaces, plus an amount to account for manufacturing tolerances, plus an amount to account for elastic or plastic deformation of the raised edge 132 and/or the movable mass 122. Thus, the edge height 138 prevents the planar lower surface 122s of the movable mass 122, as deflect towards the anti-stiction plate 128, from contacting the planar upper surface 128s of the anti-stiction plate 128, and stiction effects are mitigated.

Figure 2A:
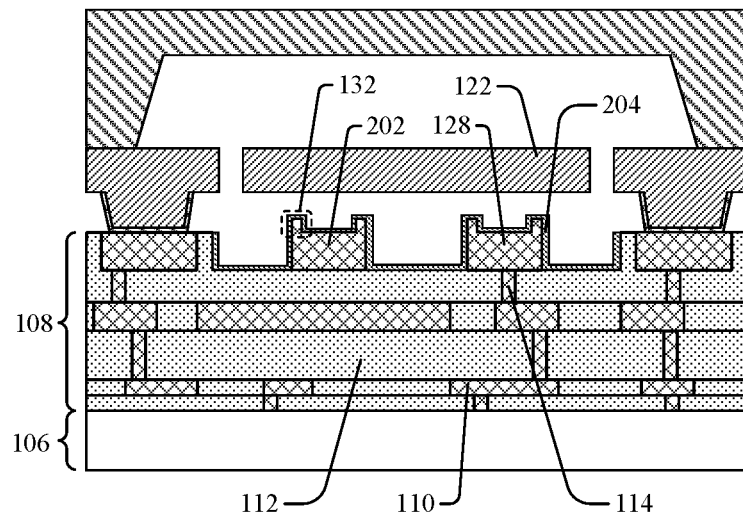
FIGS. 2A-2B illustrates a cross-sectional view of some alternate embodiments of the MEMS package including an anti-stiction feature and a fixed electrode.
Figure 2B:
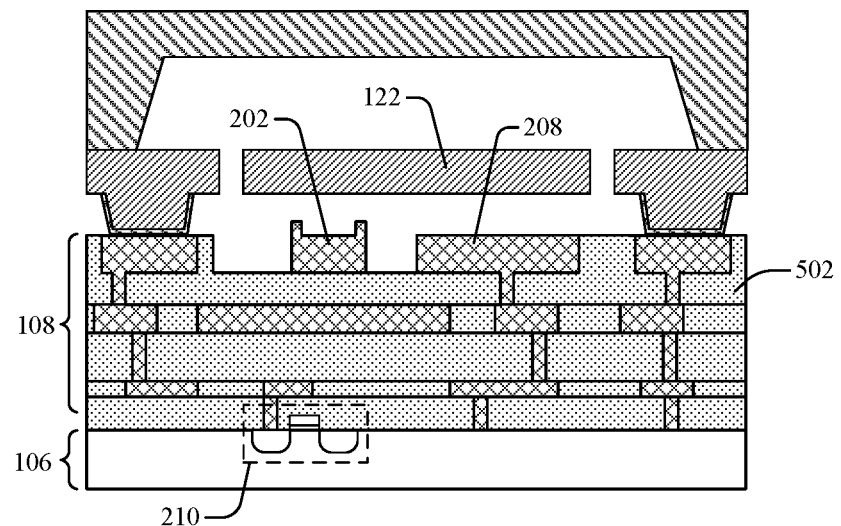

FIGS. 2A-2B illustrate some alternative embodiments of a MEMS package including an anti-stiction feature and a fixed electrode.

With reference to FIG. 2A, in some embodiments a MEMS package 200 may have an anti-stiction plate 128 that also functions as a fixed electrode configured to sense displacement of the movable mass 122. The anti-stiction plate 128 is disposed under and confined within a vertical projection of the planar lower surface 122s of the movable mass 122. The anti-stiction plate 128 is electrically coupled to the conductive wires 110 of the dielectric structure 108 by a via 114. In some embodiments, an anti-stiction bumper 202 is arranged confined within the vertical projection of the planar lower surface 122s of the movable mass and is laterally spaced apart from the anti-stiction plate 128. The anti-stiction bumper 202 is not a fixed electrode (i.e., the anti-stiction bumper 202 is electrically isolated from the conductive wires 110 of the dielectric structure 108).

In some embodiments, a passivation layer 204 may be disposed over the anti-stiction plate 128 and the anti-stiction bumper 202. The passivation layer 204 may comprise one or more conformally coated materials which may comprise silicon nitride and/or resins comprising acrylic resins, polyurethane resins, silicone resins, epoxy resins, or parylene resins. In some embodiments, the passivation layer 204 may strengthen the raised edge 132 and increase its resistance to deflection or distortion from impact with the movable mass 122. In some embodiments, the passivation layer 204 may prevent corrosion or contamination of the raised edge 132 and the planar upper surface 128s of the anti-stiction plate 128. In some embodiments, the passivation layer 204 may modify the surface properties of the anti-stiction plate 128 and the anti-stiction bumper 202 and may alter their friction coefficient and/or dry-sliding characteristics, and may be optimized with respect to the material characteristics of the movable mass 122 to further mitigate stiction. In some embodiments, the passivation layer 204 may be disposed over the upper surface of the lowered central portion 118 of the dielectric structure 108 and on adjacent sidewalls. In some embodiments, the passivation layer 204 may be disposed on the anti-stiction plate 128 or the anti-stiction bumper 202.

With reference to FIG. 2B, another alternative embodiment of a MEMS package 206 is illustrated where a stationary electrode 208 functions as a fixed electrode and is paired with the anti-stiction bumper 202. In this embodiment, the stationary electrode 208 has a planar upper surface to sense movement of the movable mass 122. The planar upper surface extends between outermost sidewalls of the stationary electrode 208, so that the stationary electrode 208 has no raised edge to serve as an anti-stiction feature. The anti-stiction bumper 202 has the raised edge and provides the anti-stiction feature for the MEMS device. In some embodiments, the raised edge 132 of the anti-stiction bumper 202 may have a height that is greater than a height of the planar upper surface of the stationary electrode 208.

In some embodiments, the CMOS substrate 106 may comprise one or more semiconductor devices 210 (e.g., MOSFETS) configured to operate as a measurement circuit configured to detect a distance change between the movable mass 122 and the planar upper surface of the stationary electrode 208. For example, the change in distance may be interpreted by circuitry comprising the semiconductor devices 210 and designed to detect changes of a varying current, voltage or capacitance measured between the movable mass 122 and the planar upper surface of the stationary electrode 208 as a result of a changing distance.

With reference to FIGS. 3A-3F, cross-sectional profiles of various embodiments of the raised edge feature of a disclosed anti-stiction plate are illustrated.

Figure 3A:
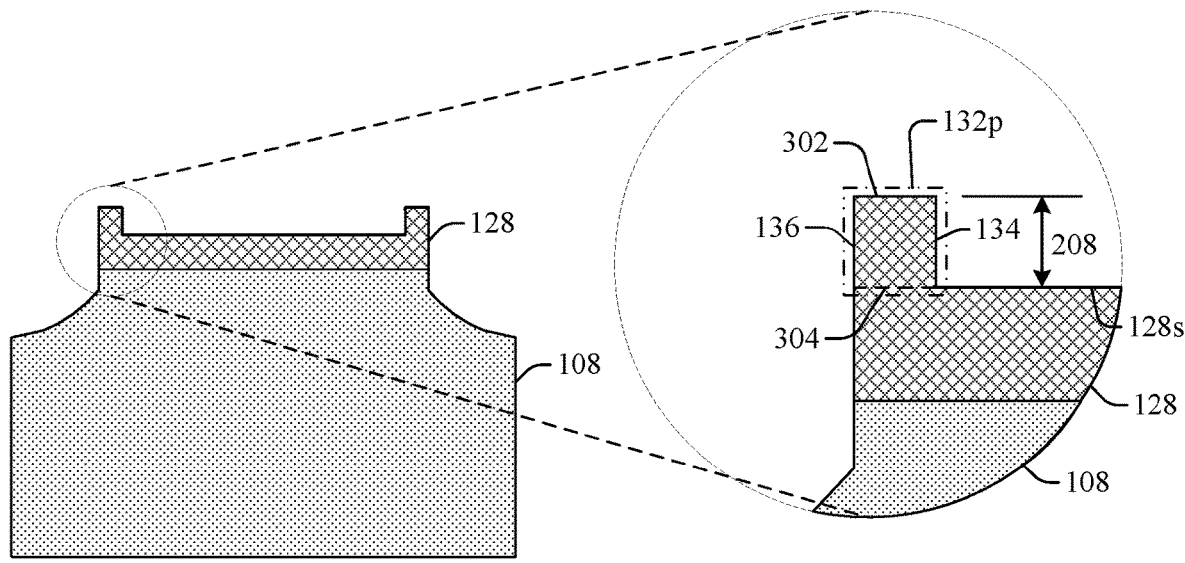
FIGS. 3A-3F illustrate a series of cross-sectional views of some embodiments of some raised edge profiles.

FIG. 3A illustrates a simple rectangular cross-sectional profile 132p. The raised edge cross-sectional profile 132p is defined by the area enclosed by the upper segment 302, the neighboring inner sidewall 134 and outer sidewall 136, and a lower boundary 304. The upper segment 302 connects between the upper extents of the neighboring inner sidewall 134 and outer sidewall 136. The lower boundary 304 is established by a lateral extension of the planar upper surface 128s to intersect the neighboring inner sidewall 134 and outer sidewall 136. The neighboring inner sidewall 134 and outer sidewall 136 represent sidewalls of a given raised edge cross-section.

If no upper segment 302 exists (e.g., when the neighboring inner sidewall 134 and outer sidewall 136 meet at a point or an apex) then the raised edge cross-sectional profile is defined by the area enclosed by the inner sidewall 134, the outer sidewall 136 and the lower boundary 304. For example, FIGS. 3B-3C illustrate some embodiments where the raised edge comprises a peak-shaped cross-sectional profile, with the neighboring inner sidewall 134 and outer sidewall 136 having inner and outer curvilinear profiles, respectively, that transition monotonically from separate lowermost points to a common uppermost point forming an apex.

Figure 3B:
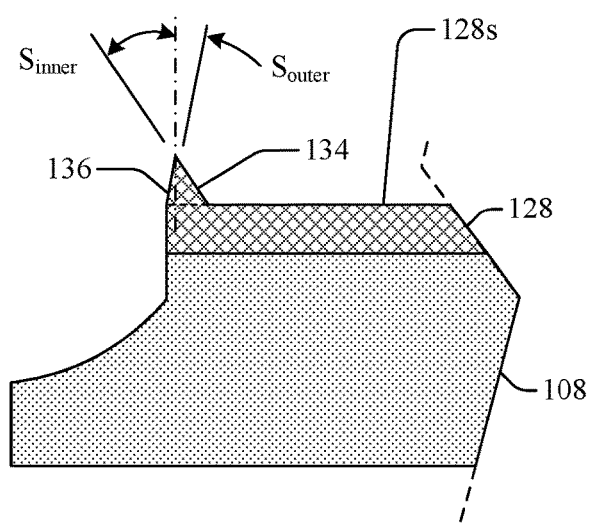
Figure 3C:
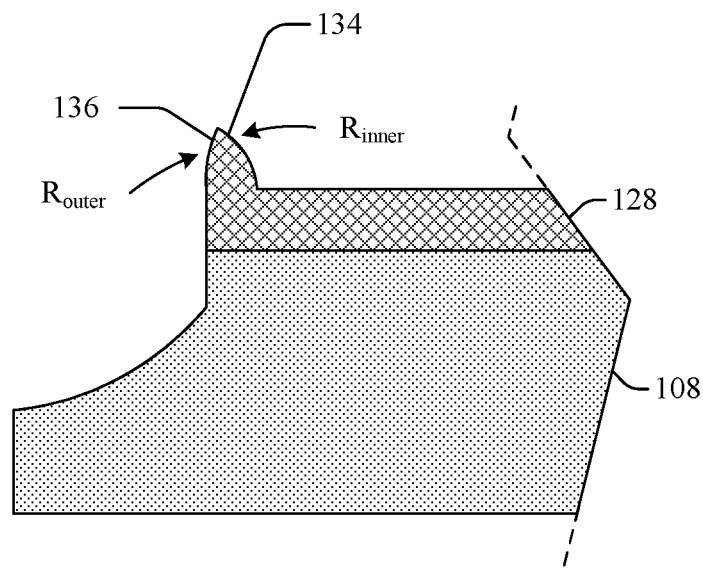

In some embodiments, shown in FIG. 3B, the inner and outer curvilinear profiles are substantially linear and comprise inner slope $S_{inner}$ and outer slope $S_{outer}$ relative to vertical, respectively. In some embodiments, the outer slope is more vertically oriented than the inner slope. In other embodiments, shown in FIG. 3C, the inner and outer curvilinear profiles are substantially curved and comprise inner and outer radii, respectively, and the outer radius $R_{outer}$ is greater than the inner radius $R_{inner}$. In some embodiments, the inner sidewall 134 may be substantially linear in profile while the outer sidewall 136 may be substantially curved in profile, or vice versa.

Figure 3D:
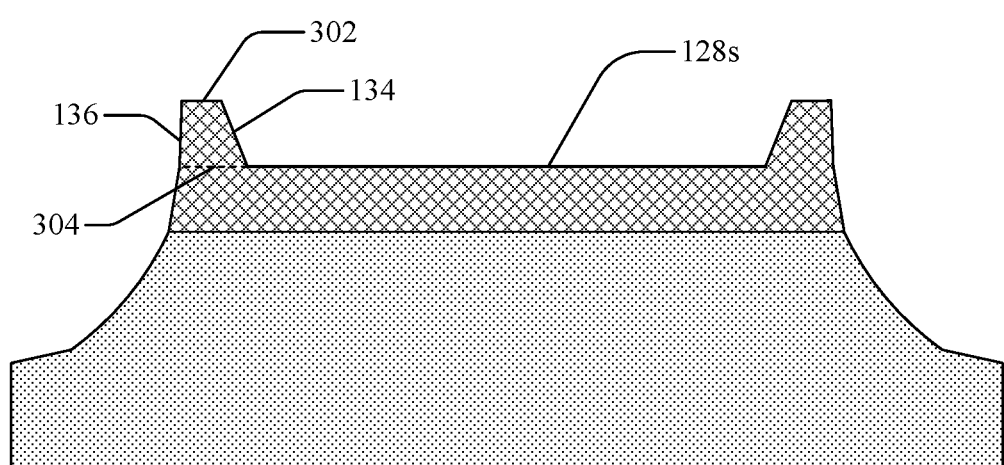

With reference to FIG. 3D, in some embodiments the raised edge comprises a trapezoidal cross-sectional profile, with an upper segment 302 substantially parallel to the planar upper surface 128s of the anti-stiction plate 128.

Figure 3E:
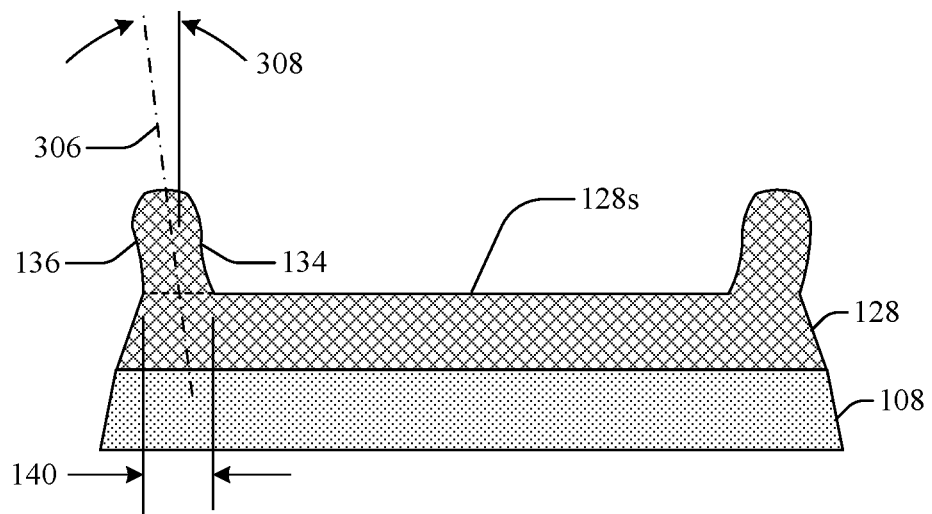
Figure 3F:
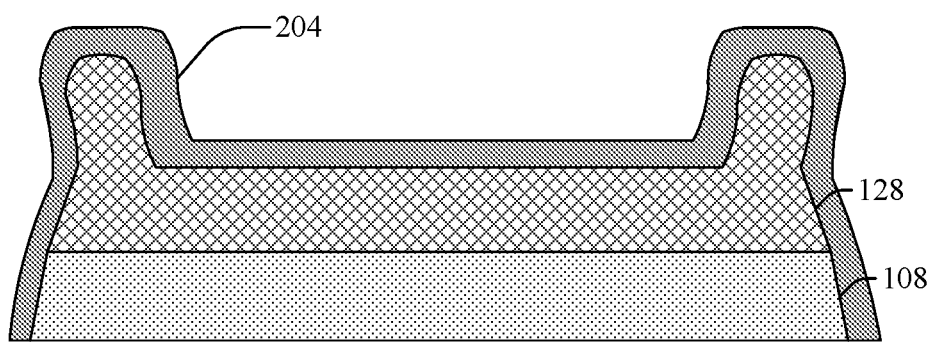

With reference to FIG. 3E, in some embodiments the raised edge comprises a substantially bulbous-shaped cross-section. In some embodiments, neighboring inner sidewall 134 and outer sidewall 136 form substantially mirror image profiles separated by the edge width 140 at their lowermost extent, and joined at a common point at their uppermost extents to form a substantially rounded top. In some embodiments, the bulbous-shaped cross-section comprises an axis 306 intersecting the common point at the uppermost extent of the inner sidewall 134 and the outer sidewall 136, and a mid-point between lowermost extents of the inner sidewall 134 and the outer sidewall 136. The axis 306 may be oriented at an angle 308 that is less than 45 degrees as measured from vertical. With reference to FIG. 3F, the raised edge and the planar upper surface 128s of the anti-stiction plate 128 may be covered with a passivation layer 204.

In some additional embodiments, and following any of the cross-sectional profiles as illustrated in FIGS. 3A-F, the raised edge may comprise a ring-shaped fence (not shown) encircling at least a part of the perimeter of the planar upper surface 128s of the anti-stiction plate 128. In some embodiments, the raised edge may not encircle the entire perimeter of the anti-stiction plate 128. As discussed herein, the raised edge may be fabricated by the action of etched metal redepositing around a mask covering the surface of the planar upper surface 128s on the anti-stiction plate 128. As such, in some embodiments that raised edge cross-section may vary from one point of the ring-shaped fence to another. In some embodiments, the raised edge may be disposed on one portion of the perimeter of the planar upper surface 128s of the anti-stiction plate 128, and less so on others.

In general, FIGS. 3A-3F and the discussion herein illustrate a few of the many possibilities for cross-sectional profiles and configurations of the raised edge, and do not represent a full complement of shapes that may be fabricated. The description herein is, therefore, not intended to be limiting. Those skilled in the art of semiconductor manufacturing will appreciate that variations of these shapes and other shapes may be easily fabricated to form differing profiles of raised edge that conform to the height, width, span distance, and perimeter locations as defined herein, and to serve a similar function.

FIGS. 4-13 illustrate a series of cross-sectional views 400-1400 of some embodiments of a method for manufacturing a MEMS package with an anti-stiction plate featuring a planar upper surface surrounded by a raised edge on its perimeter. Aside from advantageously limiting the effects of stiction, an anti-stiction plate featuring a raised edge is simple and economical to incorporate into semiconductor manufacturing processes. The materials and processes used are compatible with other MEMS materials (e.g. bulk silicon), and employing these processes and these materials avoids contamination which may be associated with new or different materials or coatings. In fact, the edge may be fabricated in-situ with a metal etching step and be formed without the need for extra processing steps or masks, thus representing a cost and efficiency savings compared to fabricating separate metal bumpers to serve as anti-stiction features.

Figure 4:
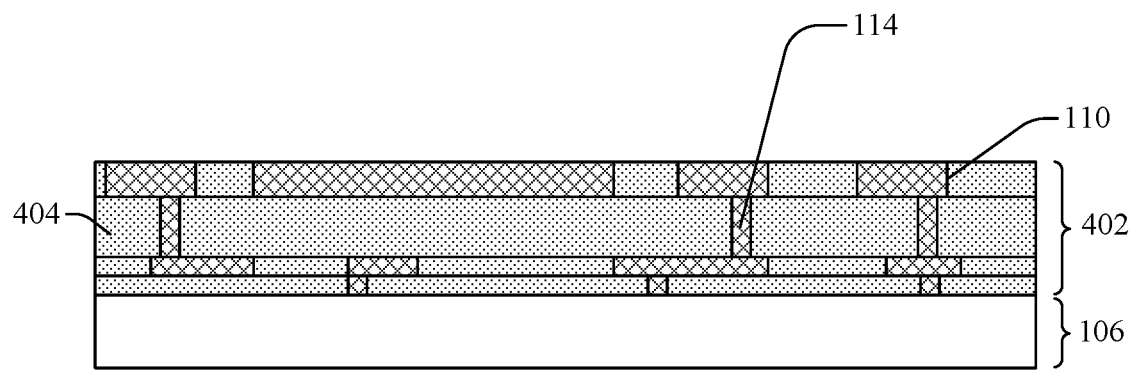
FIGS. 4-13 illustrate a series of cross-sectional views of some embodiments illustrating a method of manufacturing a MEMS package including an anti-stiction plate with a raised peripheral edge.

FIG. 4 illustrates some embodiments of a cross-sectional view 400 showing a CMOS IC 102 comprising a plurality of dielectric layers 402 formed over a CMOS substrate 106. The plurality of dielectric layers 402 surround a plurality of conductive interconnect layers, 110 and 114. A plurality of semiconductor devices may be formed within the CMOS substrate 106. In some embodiments, the CMOS substrate 106 may comprise any type of semiconductor body (e.g., silicon/CMOS bulk, SiGe, SOI, etc.) such as a semiconductor wafer or one or more die on a wafer, as well as any other type of semiconductor and/or epitaxial layers formed thereon and/or otherwise associated therewith.

In some embodiments, the plurality of dielectric layers 402 comprise stacked layers 404 of low-k dielectric materials or an oxides and/or nitride such as silicon dioxide. In some embodiments, the dielectric layers 402 may be grown by a physical vapor deposition technique (e.g., PVD, CVD, etc.). The dielectric layers 402 may be etched to form via holes and/or trenches, which are subsequently filled with a metal forming the vias 114 and the conductive wires 110, respectively. The via holes and/or trenches may be filled with a metal by a deposition process and/or a plating process (e.g., electroplating, electro-less plating, etc.). In various embodiments, the materials for the vias 114 and the plurality of conductive wires 110 may comprise tungsten, copper, or aluminum copper, for example.

Figure 5:
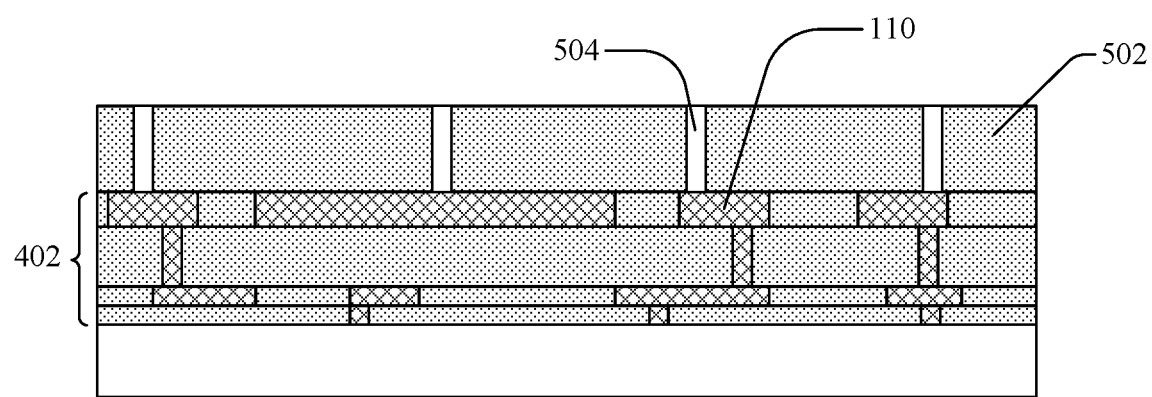

FIG. 5 illustrates some embodiments of a cross-sectional view 500 showing selective patterning of an upper dielectric layer 502 to form via holes 504. The patterning is accomplished, for example, by using photolithography methods, and then vertically etching the upper dielectric layer 502 to form via holes 504 that extend to the upper surfaces of conductive wires 110 within the plurality of dielectric layers 402.

Figure 6:
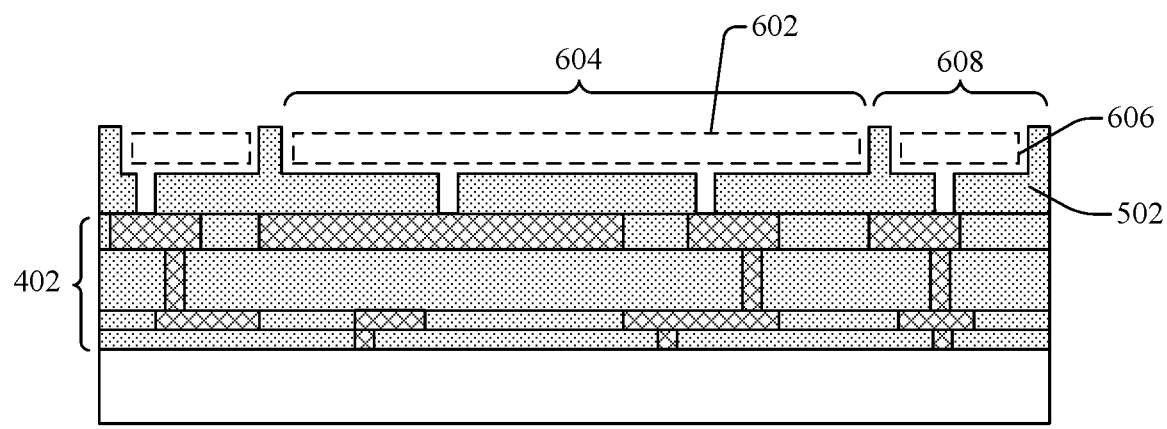

FIG. 6 illustrates some embodiments of a cross-sectional view 600 showing patterning of the upper dielectric layer 502 to form trenches. In some embodiments, a metal region trench 602 is formed within a central region 604 of the upper dielectric layer 502, and bonding pad trenches 606 are formed within outer regions 608 of the upper dielectric layer 502. Once formed, the bonding pad trenches 606 are separated from the outer regions 608 by the upper dielectric layer 502.

Figure 7:
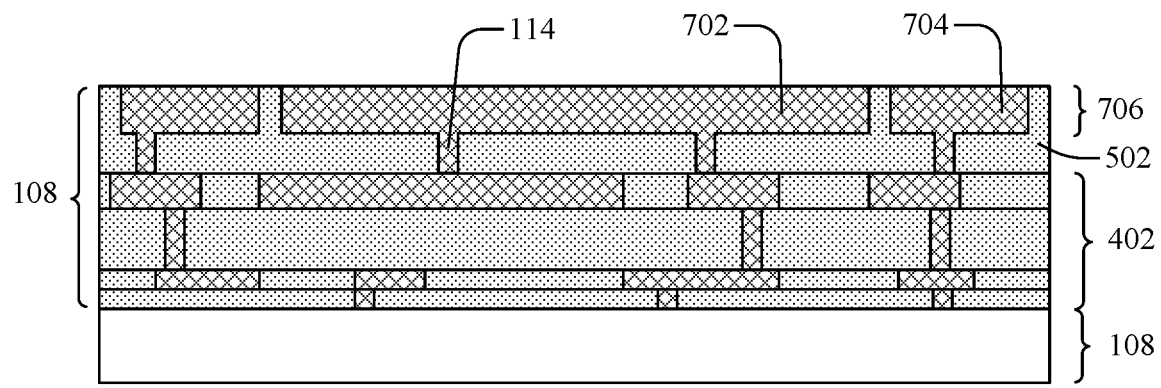

FIG. 7 illustrates some embodiments of a cross-sectional view 700 showing the formation of the metal region 702 and the bonding pads 704 within the upper metal layer 706. As shown in cross-section view 700, the via holes 504, metal region trench 602, and the bonding pad trenches 606 are filled with a conductive material to form the vias 114, the metal region 702 and the bonding pads 704, respectively. In some embodiments, the vias 114, the metal region 702, and the bonding pads 704 may be formed using a metal deposition process and/or a plating process (e.g., electroplating, electro-less plating, etc.). In some embodiments, the metal of the metal region 702 and the bonding pads 704 is of the same type as used for the conductive wires 110 within dielectric structure 108. In some embodiments, the metal region 702 and the bonding pads 704 may comprise tungsten, copper, or aluminum copper, for example.

In some embodiments, a chemical mechanical planarization (CMP) process follows the metal deposition step. The CMP process removes excess metal deposited over the upper surface of the upper dielectric layer 502, resulting in a planar upper surface comprised of the metal region 702, the bonding pads 704, and exposed upper surfaces of the upper dielectric layer 502. The upper dielectric layer 502 electrically isolates the metal region 702 from the bonding pads 704.

Figure 8:
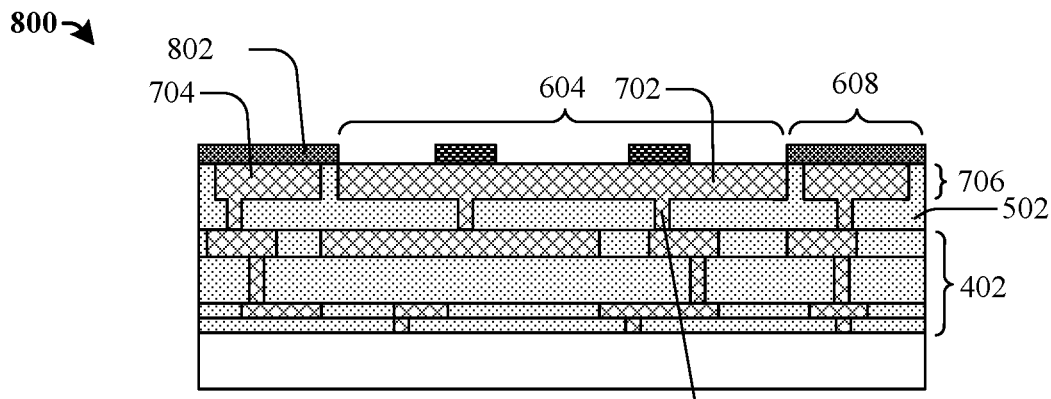

FIG. 8 illustrates some embodiments of a cross-sectional view 800 showing the formation of a masking layer 802 to cover the outer regions 608 and selective areas of the metal region 702 contained within the upper metal layer 706. The masking layer 802 may be formed, for example, by using photolithographic methods, to selectively cover one or more areas of the metal region 702. The covered areas will align over one or more vias 114. The covered areas will also align under a movable mass 122 of an overlying MEMS device layer 124 that is subsequently bonded to the bonding pads 704.

Figure 9A:
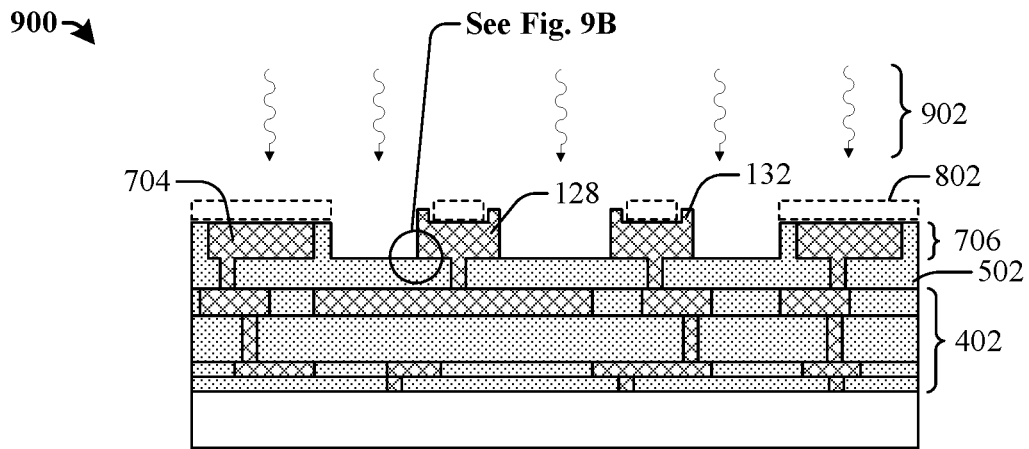

FIG. 9A illustrates some embodiments of a cross-sectional view 900 showing the formation of the anti-stiction plate 128 by the action of a sputter etching technique 902. The sputter etching technique 902 may comprise a high bombardment etching process comprising sputter etching, ion etching, plasma etching, or dry etching. The sputter etching technique 902 is performed with masking layer 802 in place (shown in phantom) and subjects the metal region 702 to etching. The sputter etching technique 902 ejects metal particles from the metal region 702 by bombardment with high energy particles or gas ions, dislodging atoms from the metal which are at least partially re-deposited on to sidewalls of the masking layer 802. The re-deposited atoms bridge with the underlying metal of the metal region 702 that is covered by the masking layer 802, and form the raised edge 132 that at least partially surrounds the perimeter of the masked area. In some embodiments, metal is removed from the metal region 702 except where covered by the masking layer 802 or where re-deposited on the sidewalls of the masking layer 802 and forming the raised edge 132.

Figure 9B:
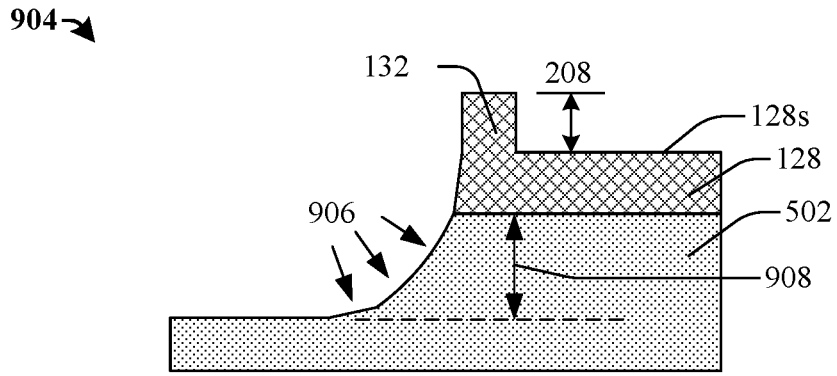

As depicted in cross-sectional view 904 of FIG. 9B, limited erosion 906 to a depth 908 may occur to the upper dielectric layer 502 in the process of removing the metal by the sputter etching technique. However, the sputter etching technique 902 is terminated before the erosion 906 may proceed to a depth that would substantially impair the insulating capability of the upper dielectric layer 502 in relation to electrically isolating the metal region 702 from the bonding pads 704, or from electrically isolating any underlying metal layers of the plurality of metal wire layers (e.g., 110 and 114).

In some embodiments, the sputter etching technique 902 may comprise an etchant chemistry having gases including CF4, CH2F2, Cl2, BCl3 and/or other chemicals. In some other embodiments, the sputter etching technique 902 may comprise an ion etching process that uses argon (Ar) as one of energetic particles. In some embodiments, an argon (Ar) plasma is used by the sputter etching technique 902.

The masking layer 802 is subsequently removed or stripped, after the sputter etching technique 902 has been completed. Removal of the masking layer 802 results in redeposited metal forming the raised edge 132 surrounding the perimeter of the anti-stiction plate 128, and the masking layer 802 preserves the planar upper surface 128s beneath the masking layer. The raised edge 132 has an edge height 208 as measured from the height of the metal region 702. The edge height 138 serves as a barrier to prevent a planar lower surface 122s of a movable mass 122 from contacting the planar upper surface 128s of the anti-stiction plate 128. Thus, an effective anti-stiction feature has been created within an existing process step of selectively removing metal from the upper metal layer 706. In contrast to known methods of creating anti-stiction bumpers, the process disclosed herein requires no extra processing steps and no additional photolithography processes to shape the raised edges.

Figure 10:
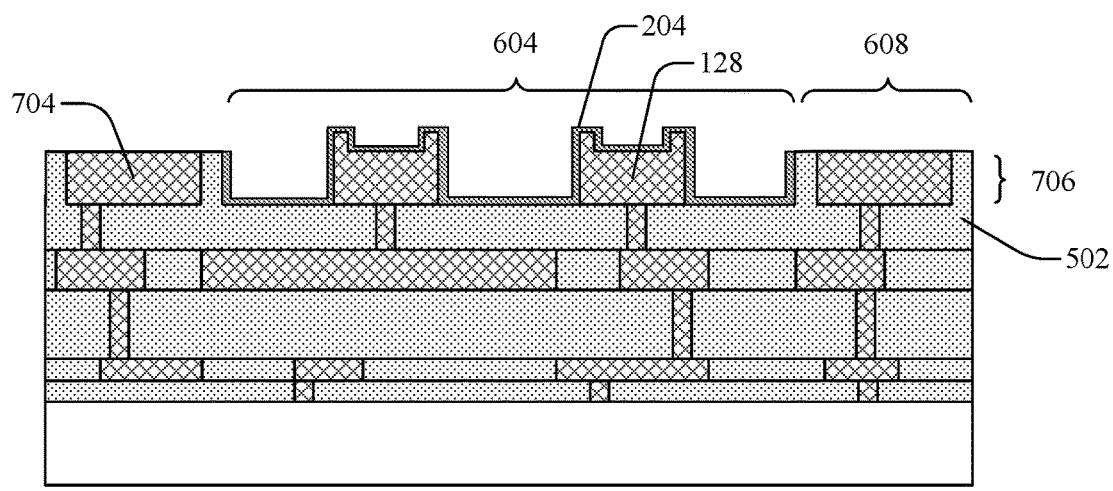

FIG. 10 depicts a cross-sectional view 1000 showing the optional formation of a passivation layer 204 over at least the raised edge 132. In some embodiments, the passivation layer 204 may be formed by a deposition process. In other embodiments, the passivation layer may be formed by a thermal growth process within a processing furnace. The thickness and materials employed for the formation of the passivation layer 204 may vary according to the desired function and properties of the passivation layer 204. The passivation process may comprise forming conformal coatings which may comprise an oxide, silicon nitride, and/or resins comprising acrylic resins, polyurethane resins, silicone resins, epoxy resins, or parylene resins. In some embodiments, the passivation layer 204 may strengthen the raised edge 132 and increase its resistance to deflection or distortion from impact with the movable mass 122. In some embodiments, the passivation layer 204 may prevent corrosion or contamination of the raised edge 132 and the planar upper surface 128s of the anti-stiction plate 128. In some embodiments, the passivation layer 204 may alter the friction coefficient and dry-sliding character of the raised edge 132 and/or the planar upper surface 128s, and may be optimized with respect to the material characteristics of the movable mass 122 to further mitigate stiction. In some embodiments, the passivation layer 204 may be disposed over the central region 604 of the upper metal layer 706. In some embodiments, the passivation layer 204 may be disposed on the anti-stiction plate 128 and the raised edge 132.

Figure 11:
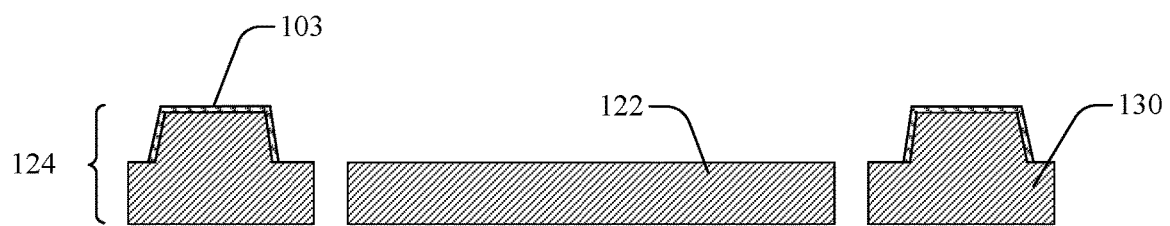

FIG. 11 illustrates a cross-sectional view 1100 showing a MEMS device layer 124. The MEMS device layer 124 comprises a fixed portion 130 of a MEMS device and a movable mass 122 connected (not shown, out of plane) to the fixed portion 130. The MEMS device layer 124 comprises a bonding layer 103 formed over the outer and fixed regions of the MEMS device layer 124. In some embodiments, the bonding layer 103 may comprise a metal.

Figure 12:
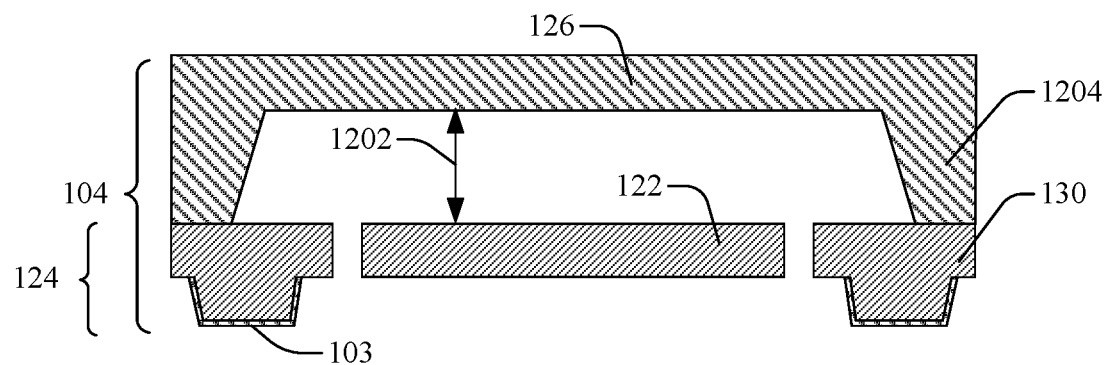

FIG. 12 illustrates a cross-sectional view 1200 showing a capping substrate 126 being bonded to an upper face of the flipped MEMS device layer 124, opposite to the bonding layer 103. A MEMS IC 104 comprises the MEMS device layer 124 bonded to the capping substrate 126. In some embodiments, the capping substrate 126 can be prepared from a bulk semiconductor wafer including, for example, a monocrystalline wafer, or another substrate made of germanium, silicon carbide, a group III element, and/or a group V element, for example.

In some embodiments, a recess 1202 can be etched in the capping substrate 126 at a location corresponding to movable or flexible portion of the MEMS device layer 124. Among other considerations, applicable heights of a protrusion 1204 defining the recess 1202 are formed with a consideration of providing sufficient space for motion between a movable or flexible part of the MEMS device to be formed and a neighboring component. In some embodiments, the MEMS device layer 124 may be patterned to form MEMS devices including a movable mass 122. The MEMS devices may include, for example, micro-actuators or micro-sensors such as a micro-valve, a micro-switch, a microphone, a pressure sensor, an accelerator, a gyroscope or any other device having a movable or flexible part that moves or flexes with respect to the fixed portion.

Figure 13:
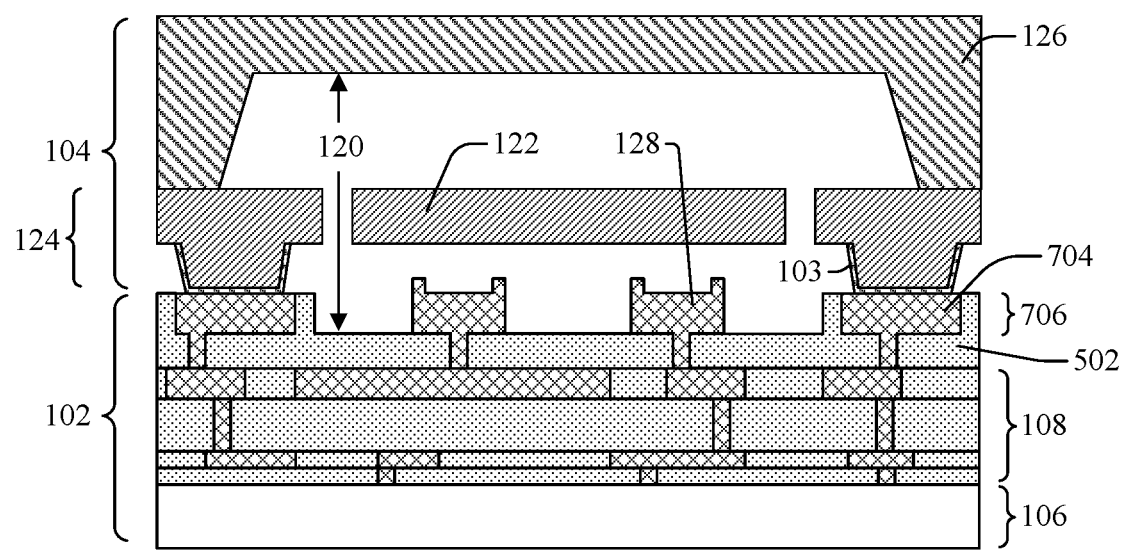

FIG. 13 illustrates bonding the MEMS IC 104 to the CMOS IC 102. The bonding layer 103 of the MEMS IC 104 is bonded to the bonding pads 704 of the CMOS IC 102, and the bonding pads 704 are electrically isolated from the anti-stiction plate 128 located over the dielectric structure 108. The MEMS IC 104, in cooperation with the upper dielectric layer 502, defines a cavity 120, and the movable mass 122 of the MEMS IC 104 is arranged within the cavity 120 and overlies the anti-stiction plate 128.

In some embodiments, the MEMS IC 104 and the CMOS IC 102 are bonded by semiconductor-to-metal bonding where the bonding layer 103 comprises metal materials such as Al, Cu, Ti, Ta, Au, Ni, Sn and the CMOS IC 102 bonding pad 704 comprises semiconductor materials such as Ge, Si, SiGe. In some other embodiments, the MEMS IC 104 and the CMOS IC 102 are bonded by eutectic bonding between two metal materials each including at least one of Al, Cu, Ti, Ta, Au, Ni, Sn, or another metal. In such embodiments, the materials to be bonded are pressed against each other in an annealing process to form a eutectic phase of the materials. For example, a eutectic bonding between Ge and Al is formed at an annealing temperature in a range from 400° C. to 450° C. In some embodiments, after the MEMS IC 104 is bonded to the CMOS IC 102, the MEMS package 100 is formed when the bonded CMOS IC 102 and MEMS IC 104, which are often bonded at the wafer level, are diced into separate chips after bonding.

Figure 14:
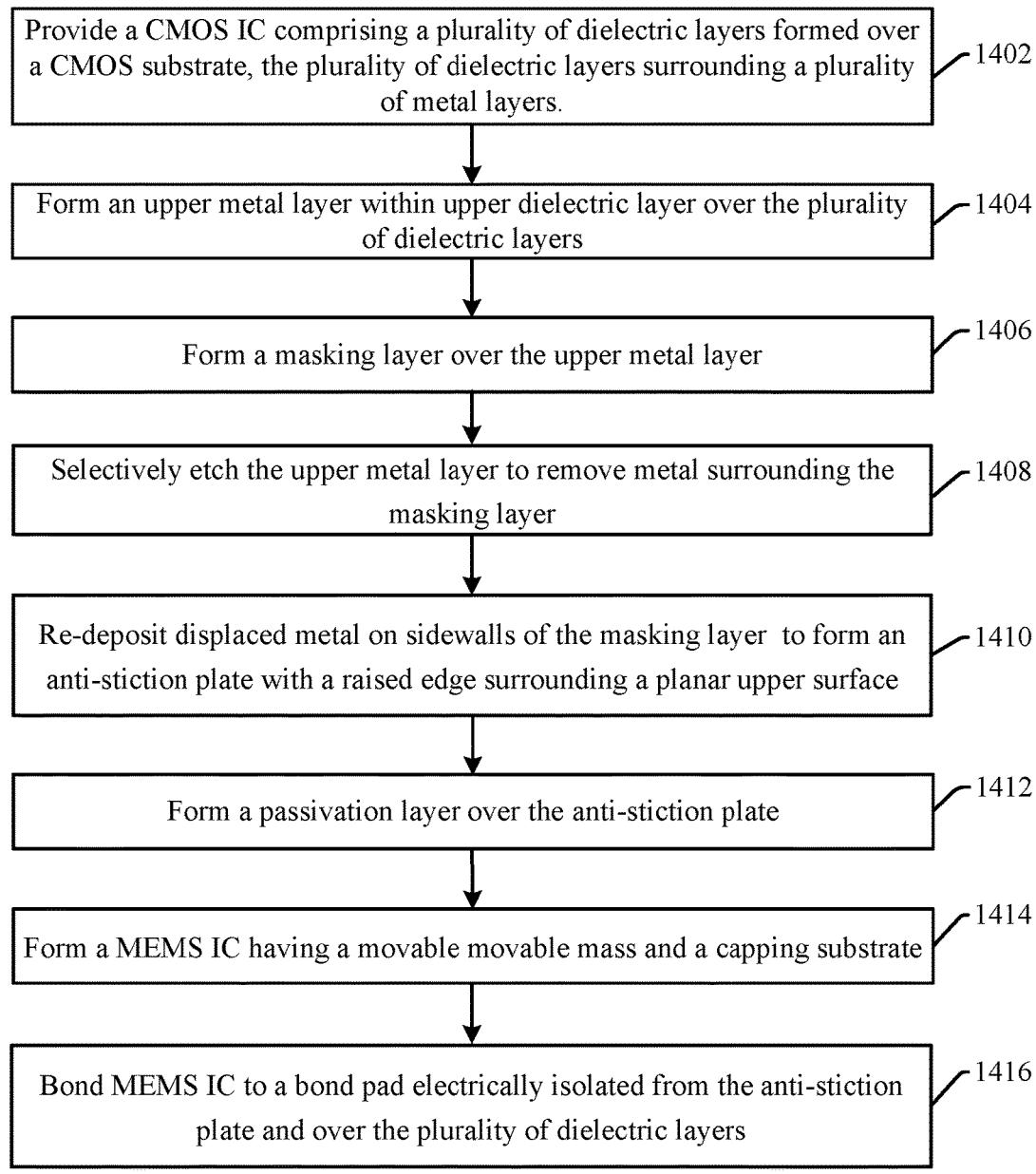
FIG. 14 illustrates a flowchart of some embodiments of a method of manufacturing a MEMS package including an anti-stiction plate with a raised peripheral edge.

FIG. 14 illustrates a flowchart 1400 of some embodiments of a method for manufacturing a MEMS package with a raised edge anti-stiction plate.

While the disclosed method is illustrated by flowchart 1400 and described herein as a series of acts or events, it will be appreciated that the illustrated ordering of such acts or events are not to be interpreted in a limiting sense. For example, some acts may occur in different orders and/or concurrently with other acts or events apart from those illustrated and/or described herein. In addition, not all illustrated acts may be required to implement one or more aspects or embodiments of the description herein. Further, one or more of the acts depicted herein may be carried out in one or more separate acts and/or phases.

At 1402, a CMOS IC is provided. The CMOS IC comprises a plurality of dielectric layers formed over a CMOS substrate and surrounding a plurality of metal layers. FIG. 4 illustrates a cross-sectional view corresponding to some embodiments of act 1402.

At 1404, an upper metal layer is formed within an upper dielectric layer over the plurality of dielectric layers. FIG.

5-7 illustrates cross-sectional views 500-700 corresponding to some embodiments of act 1404.

At 1406, a masking layer is formed over the upper metal layer. FIG. 8 illustrates a cross-sectional view 800 corresponding to some embodiments of forming the masking layer.

At 1408, the upper metal layer is selectively etched to remove metal surrounding the masking layer. In some embodiments, the etching process comprises a sputter etching technique. FIG. 9 illustrates a cross-sectional view 900 corresponding to some embodiments of act 1408.

At 1410, metal removed by the etching process is redeposited on sidewalls of the masking layer to form an anti-stiction plate with a raised edge surrounding a planar upper surface. The raised edge height exceeds the height of the planar upper surface of the anti-stiction plate. FIGS. 9A-9B illustrate cross-sectional views, 900 and 904, corresponding to some embodiments of act 1410.

At 1412, the anti-stiction plate may be optionally coated with a passivation layer. FIG. 10 illustrates a cross-sectional view corresponding to some embodiments of act 1412.

At 1414, a MEMS IC comprising a movable mass and a capping substrate is formed. The capping substrate may comprise a recess to accommodate movement of the movable mass. FIGS. 11 and 12 illustrate cross-sectional views 1100-1200 corresponding to some embodiments of act 1414.

At 1416, the MEMS IC is bonded to the CMOS IC at a bond pad electrically isolated from the anti-stiction plate and positioned over the plurality of dielectric layers. The action of bonding the MEMS IC to the bonding pad forms a cavity between the MEMS IC and the plurality of dielectric layers. The movable mass of the MEMS IC is arranged within the cavity and overlying the anti-stiction plate. FIG. 13 illustrates a cross-sectional view 1300 corresponding to some embodiments of act 1416.

In view of the foregoing, some embodiments of the present application provide a microelectromechanical systems (MEMS) package comprising a CMOS integrated chip (IC) comprising a CMOS substrate and a dielectric structure disposed above the substrate. The dielectric structure surrounds a plurality of conductive interconnect layers. A MEMS IC is disposed above and bonded to the dielectric structure, wherein the MEMS IC in cooperation with a lowered central portion of the dielectric structure defines a cavity, and wherein the MEMS IC comprises a movable mass arranged within the cavity. An anti-stiction plate is between the movable mass and the lowered central portion of the dielectric structure. The anti-stiction plate is made of a conductive material and comprises a raised edge surrounding at least a part of a perimeter of a substantially planar upper surface.

Further, other embodiments of the present application provide a microelectromechanical systems (MEMS) package comprising a CMOS integrated chip (IC) comprising a CMOS substrate and a dielectric structure disposed above the substrate, wherein the dielectric structure surrounds a plurality of conductive interconnect layers. A MEMS device layer is disposed above and bonded to raised outer portions of the dielectric structure surrounding a recessed surface of the dielectric structure. The MEMS device layer comprises a fixed portion and a movable mass connected to the fixed portion. A capping substrate is disposed above and bonded to a back side of the MEMS device layer opposite to the dielectric structure so as to enclose a cavity between the capping substrate and the dielectric structure, and the movable mass is arranged in the cavity. A fixed electrode is arranged on the recessed surface under the movable mass. The fixed electrode is made of a metal and comprises a raised edge surrounding a perimeter of the substantially planar upper surface.

Further yet, other embodiments of the present application provide a method for fabricating an anti-stiction device. The method comprises providing a CMOS IC comprising a plurality of dielectric layers formed over a CMOS substrate. The plurality of dielectric layers surround a plurality of metal layers. The method further comprises forming an upper metal layer over the plurality of dielectric layers, and forming a masking layer over the upper metal layer. The method further comprises selectively etching the upper metal layer to remove metal surrounding the masking layer, with displaced metal redepositing on sidewalls of the masking layer to a height that exceeds a height of the upper metal layer to form an anti-stiction plate with a raised edge of redeposited metal surrounding a planar upper surface. The method further comprises bonding a MEMS IC to a bond pad electrically isolated from the anti-stiction plate and positioned over the plurality of dielectric layers. The MEMS IC in cooperation with the plurality of dielectric layers defines a cavity, and the MEMS IC comprises a movable mass arranged within the cavity and overlying the anti-stiction plate.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A microelectromechanical systems (MEMS) package comprising:
   a CMOS integrated chip (IC) comprising a CMOS substrate and a dielectric structure disposed above the CMOS substrate, wherein the dielectric structure surrounds a plurality of conductive interconnect layers;
   a MEMS IC disposed above and bonded to the dielectric structure, wherein the MEMS IC in cooperation with a lowered central portion of the dielectric structure defines a cavity, and wherein the MEMS IC comprises a movable mass arranged within the cavity; and
   an anti-stiction plate disposed between the movable mass and the lowered central portion of the dielectric structure, wherein the anti-stiction plate is made of a metal that comprises a raised protrusion surrounding at least a part of a perimeter of a substantially planar upper surface of the anti-stiction plate, and wherein the raised protrusion of the metal has an uppermost surface that is higher than an uppermost surface of one of the plurality of conductive interconnect layers that is laterally spaced from and in a same plane as the anti-stiction plate;
   wherein the dielectric structure has a curved sidewall that is directly coupled to a vertical sidewall of the dielectric structure, the vertical sidewall of the dielectric structure and an outermost sidewall of the anti-stiction plate are arranged along a line that is perpendicular to the substantially planar upper surface of the anti-stiction plate.

2. The MEMS package of claim 1, wherein the raised protrusion is defined by angled sidewalls that meet at a point that is directly over the anti-stiction plate and that is laterally set back from the outermost sidewall of the anti-stiction plate by a non-zero distance.

3. The MEMS package of claim 1, wherein the raised protrusion is defined by an outer sidewall that is angled at a non-zero angle with respect to the line that is perpendicular to the substantially planar upper surface of the anti-stiction plate.

4. The MEMS package of claim 1, further comprising:
a fixed electrode arranged over the dielectric structure at a location laterally spaced apart from the anti-stiction plate, wherein the anti-stiction plate is electrically isolated from the plurality of conductive interconnect layers.

5. The MEMS package of claim 4, wherein the raised protrusion is defined by both the outermost sidewall of the anti-stiction plate and an uppermost surface of the anti-stiction plate.

6. The MEMS package of claim 4, wherein the fixed electrode has a second raised edge surrounding at least a part of a perimeter of a substantially planar second upper surface.

7. The MEMS package of claim 1, further comprising:
a passivation layer disposed on and in contact with the anti-stiction plate, wherein the passivation layer continuously extends from over the raised protrusion to cover an additional sidewall of the dielectric structure that faces the anti-stiction plate and that is coupled to an uppermost surface of the dielectric structure.

8. The MEMS package of claim 1, wherein the dielectric structure has an upper surface that continuously extends between sidewalls of the dielectric structure, wherein the sidewalls are coupled to an uppermost surface of the dielectric structure, and wherein the anti-stiction plate contacts the upper surface of the dielectric structure.

9. The MEMS package of claim 1, wherein the raised protrusion comprises a trapezoid-shaped cross-section having an upper segment that is arranged between neighboring inner and outer sidewalls and that is substantially parallel to the substantially planar upper surface of the anti-stiction plate.

10. The MEMS package of claim 1, wherein the raised protrusion comprises a substantially bulbous-shaped cross-section, wherein inner and outer neighboring sidewalls are curved and form substantially mirror image profiles separated at their lowermost extents and joined at a common point at their uppermost extents to form a rounded top.

11. The MEMS package of claim 10, wherein the substantially bulbous-shaped cross-section is arranged along an axis intersecting the common point at the uppermost extents of the inner and outer neighboring sidewalls, and a midpoint between the lowermost extents of the inner and outer neighboring sidewalls, and wherein the axis is oriented at an angle that is less than 45 degrees as measured from vertical.

12. The MEMS package of claim 1,
wherein a first horizontal line extends along the substantially planar upper surface of the anti-stiction plate and along uppermost surfaces of the dielectric structure and the one of the plurality of conductive interconnect layers;
wherein a second horizontal line extends along a top of the raised protrusion and over the uppermost surface of the dielectric structure; and
wherein the first horizontal line and the second horizontal line are parallel to the substantially planar upper surface of the anti-stiction plate.

13. The MEMS package of claim 1, further comprising:
a masking layer disposed on the substantially planar upper surface of the anti-stiction plate, wherein the masking layer is laterally between sidewalls defining the metal defining the raised protrusion.

14. A microelectromechanical systems (MEMS) package comprising:
a dielectric structure disposed above a substrate, wherein the dielectric structure surrounds a plurality of conductive interconnect layers;
a MEMS device layer disposed above and bonded to raised outer portions of the dielectric structure surrounding a recessed region of the dielectric structure, wherein the MEMS device layer comprises a fixed portion and a movable mass connected to the fixed portion; and
a fixed electrode arranged on an upper surface of the dielectric structure within the recessed region and under the movable mass, wherein the fixed electrode is a metal comprising a raised protrusion disposed along a perimeter of a substantially planar upper surface of the fixed electrode, and wherein the upper surface of the dielectric structure continuously extends from a first outermost sidewall of the fixed electrode to a second outermost sidewall of the fixed electrode and is directly coupled to sidewalls of the dielectric structure that are between a bottom of the fixed electrode and the substrate.

15. The MEMS package of claim 14,
wherein a first vertical line extends along a first one of the sidewalls of the dielectric structure and the first outermost sidewall of the fixed electrode; and
wherein a second vertical line extends along a second one of the sidewalls of the dielectric structure and the second outermost sidewall of the fixed electrode.

16. The MEMS package of claim 14, wherein the raised protrusion comprises a ring shaped protrusion.

17. The MEMS package of claim 14,
wherein a span distance laterally separates raised edges on opposed lengths of the perimeter of the substantially planar upper surface of the fixed electrode and an edge width laterally separates inner and outer neighboring sidewalls of the raised protrusion; and
wherein a ratio of the span distance to the edge width is greater than 10.

18. The MEMS package of claim 14, wherein the raised protrusion comprises a cross-sectional profile with inner and outer neighboring sidewalls separated by an edge width, wherein the raised protrusion comprises an edge height defined by a vertical distance between the substantially planar upper surface of the fixed electrode and an uppermost extent of the raised protrusion, and wherein a ratio of the edge height to the edge width is greater than 1.

19. A microelectromechanical systems (MEMS) package, comprising:
a dielectric structure surrounding a plurality of interconnect layers arranged over a substrate, wherein a recess is defined by vertically extending sidewalls directly coupling an uppermost surface of the dielectric structure to a horizontally extending upper surface of the dielectric structure;
bonding pads disposed within the dielectric structure along the uppermost surface of the dielectric structure and electrically coupled to one or more of the plurality of interconnect layers;
a MEMS substrate disposed above and bonded to the bonding pads, wherein the MEMS substrate comprises a movable mass arranged directly over the horizontally extending upper surface of the dielectric structure; and an anti-stiction plate comprising a conductive material disposed beneath the movable mass and having a bottom surface contacting the horizontally extending upper surface of the dielectric structure, wherein the horizontally extending upper surface of the dielectric structure continuously extends between outermost sidewalls of the anti-stiction plate.

20. The MEMS package of claim 19, wherein the conductive material comprises one or more protrusions that have a height that changes as a function of a lateral position within the one or more protrusions; and wherein the height increases as a distance from an outermost sidewall of the anti-stiction plate increases until a highest point of the one or more protrusions is reached at a location that is laterally offset from the outermost sidewall by a non-zero distance.

* * * * *